United States Patent [19]

Campanelli et al.

[11] Patent Number: 4,786,357

[45] Date of Patent: Nov. 22, 1988

[54] THERMAL INK JET PRINTHEAD AND FABRICATION METHOD THEREFOR

[75] Inventors: Michael R. Campanelli, Webster; Donald J. Drake, Rochester, both of N.Y.

[73] Assignee: Xerox Corporation, Stamford, Conn.

[21] Appl. No.: 126,085

[22] Filed: Nov. 27, 1987

[51] Int. Cl.[4] ...................... H01L 21/306; B44C 1/22; C03C 15/00; C23F 1/02

[52] U.S. Cl. .................................... 156/633; 156/634; 156/644; 156/645; 156/647; 156/651; 156/656; 156/657; 156/659.1; 156/622; 156/901; 346/1.1; 346/140 R

[58] Field of Search ............... 156/629, 630, 633, 634, 156/644, 645, 647, 651, 652, 653, 656, 657, 659.1, 661.1, 662, 668, 901, 902; 346/1.1, 140 R

[56] References Cited

U.S. PATENT DOCUMENTS

| | | | |
|---|---|---|---|
| 4,412,224 | 10/1983 | Sugitani | 346/1.1 |
| 4,463,359 | 7/1984 | Ayata et al. | 346/1.1 |
| 4,532,530 | 7/1985 | Hawkins | 346/140 R |
| 4,571,599 | 2/1986 | Rezanka | 346/140 R |
| 4,577,202 | 3/1986 | Hara | 346/140 R |
| 4,601,777 | 7/1986 | Hawkins et al. | 156/626 |
| 4,611,219 | 9/1986 | Sugitani et al. | 346/140 R |
| 4,612,554 | 9/1986 | Poleshuk | 346/140 R |
| 4,638,337 | 1/1987 | Torpey et al. | 346/140 R |
| 4,639,748 | 1/1987 | Drake et al. | 346/140 R |
| 4,678,529 | 7/1987 | Drake et al. | 156/234 |

*Primary Examiner*—William A. Powell
*Attorney, Agent, or Firm*—Robert A. Chittum

[57] ABSTRACT

A plurality of thermal ink jet printheads are fabricated from two substrates, at least one of which is a (100) silcon wafer. A plurality of sets of heating element arrays are formed on one substrate, together with addressing electrodes for each heating element. A thick film insulative layer is placed over the heating elements and addressing electrodes which is patterned to remove the thick film from over the individual heating elements, placing them each in a recess, and the thermal end portions of the electrodes including the contact pads therefor. A plurality of ink supplying manifold recesses are anisotropically etched in the silicon wafer and a plurality of sets of channel grooves are formed, each set of which communicate with an associated manifold. The silicon wafer and heating element substrates are aligned and bonded together, so that each channel groove contains a heating element. The individual printheads are formed by first removing unwanted silicon above each set of end portions of electrodes by a dicing operation and then dicing the heating element substrate to obtain the individual printheads. The patterned trough in the thick film insulative layer above the electrode end portions provides the spacing between the two substrates to enable removal of the unwanted silicon without the need of etched relief recesses as used in the prior art.

4 Claims, 8 Drawing Sheets

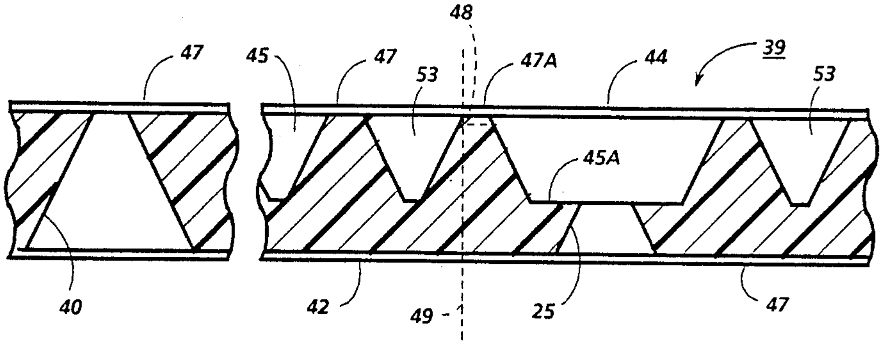
PRIOR ART FIG. 2
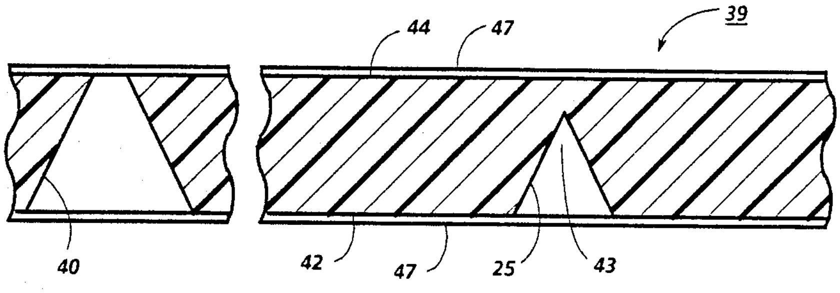
PRIOR ART FIG. 3
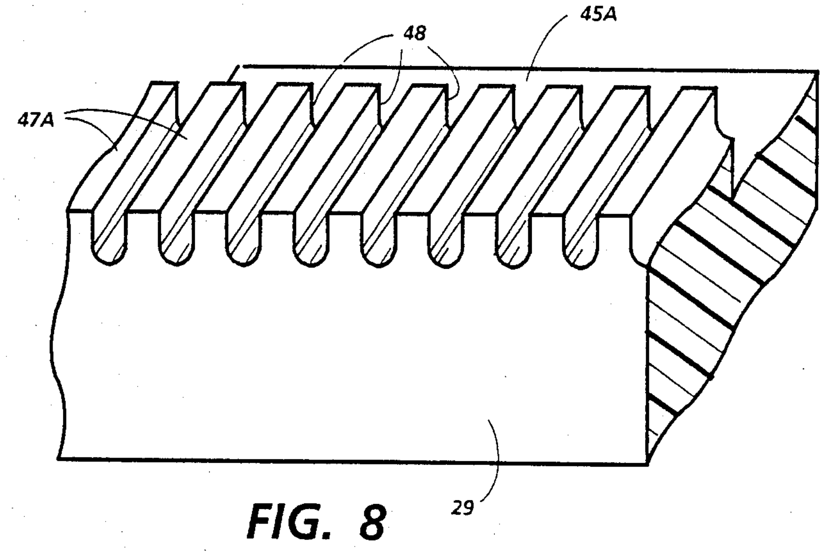
FIG. 8

THERMAL INK JET PRINTHEAD AND FABRICATION METHOD THEREFOR

BACKGROUND OF THE INVENTION

1. Field of the Invention

This invention relates to thermal ink jet printing, and more particularly to an improved fabrication process for a thermal ink jet printhead.

2. Description of the Prior Art

Thermal ink jet printing systems use thermal energy to produce a vapor bubble in an ink filled channel to expel an ink droplet on demand. Generally, thermal ink jet printing is accomplished by the use of a printhead comprising one or more ink filled channels which communicate with a relatively small supply chamber at one end and have an opening at the opposite end such as disclosed in U.S. Pat. No. 4,463,359 to Ayata et al. A resistor is located in each of the channels a predetermined distance upstream from the channel orifice. The resistors are individually addressed with a current pulse to momentarily vaporize the ink and form a bubble which expels an ink droplet.

U.S. Pat. No. 4,601,777 to Hawkins et al discloses a thermal ink jet printhead and method of fabrication. A plurality of printheads are concurrently fabricated by forming a plurality of sets of heating elements with their individual addressing electrodes on one substrate surface and etching corresponding sets of grooves which may serve as ink channels with a common reservoir in the surface of a silicon wafer. The wafer and substrate are aligned and bonded together so that each channel has a heating element. The individual printheads are obtained by milling away the unwanted silicon material in the etched wafer to expose the addressing electrode terminals on the substrate and then the bonded structure is diced into a plurality of separate printheads.

U.S. Pat. No. 4,532,530 to Hawkins discloses a carriage type thermal ink jet printing system having improved bubble generating resistors formed from doped polycrystalline. Glass mesas thermally isolate the active portion of the resistor from the silicon supporting substrate and from the electrode connecting points so that the electrode connection points are maintained relatively cool during operation. A thermally grown dielectric layer permits a thinner electrical isolation layer between the resistor and a protective ink interfacing tantalum layer, thus increasing the thermal energy transfer to the ink.

U.S. Pat. No. 4,571,599 to Rezanka discloses a plurality of disposable individually replaceable ink supply cartridges mountable on the carriage of an ink jet printer. Each cartridge has a thermal ink jet printhead fixedly attached thereto. A constant, slightly negative pressure is maintained at the nozzles of the printhead by means of a secondary reservoir with a level of ink maintained below the ink supply. The majority of the ink is stored in a hermetically sealed main reservoir in the cartridge which contains the ink supply at the negative pressure. A passageway provides ink from the main reservoir to the printhead nozzles. A secondary reservoir within the cartridge holds an air pocket at atmospheric pressure and releases air into the main reservoir as required to maintain the desired negative pressure constant as the ink supply is depleted.

U.S. Pat. No. 4,612,554 to Poleshuk discloses an ink jet printhead composed of substantially two identical parts and method of batch fabricating the parts. Each part has V-grooves anisotropically etched between a linear array of heating elements having selectively addressable electrodes which are parallel to each other. The groove structures of the parts permit them to be mated face to face, so that they may be automatically self-aligned by the intermeshing of the lands containing the heating elements on one part with the grooves of the other part. A pair of parts may be used as a printhead for a carriage-type ink jet printer or a plurality of parts may be assembled for a pagewidth printer.

U.S. Pat. No. 4,639,748 to Drake et al discloses an ink jet printhead having an integral integrated filtering system and fabricating process therefor. Each printhead is composed of two parts aligned and bonded together. One part is substantially flat substrate which contains on the surface thereof a linear array of heating elements and addressing electrodes. The other part is a flat substrate having a set of concurrently etched recesses in one surface. The set of recesses include a parallel array of elongated recesses for use as capillary filled ink channels having ink droplet emitting nozzles at one end and having interconnection with a common ink supply manifold recess at the other end. The manifold recess contains an internal closed wall defining a chamber with an ink fill hole. Small passageways are formed in the internal chamber walls to permit the passage of the ink therefrom into the manifold. Each of the passageways have smaller cross sectional flow areas than the nozzles to filter the ink, while the total cross sectional flow area of the passageways is larger than the total cross sectional flow area of the nozzles.

U.S. Pat. No. 4,678,529 to Drake et al discloses a method of bonding ink jet printhead components together by coating a flexible substrate with a relatively thin uniform layer of an adhesive having an intermediate non-tacky curing stage with a shelf life around one month for ease of alignment of the parts and ease of storage of the components having the adhesive thereon. About half of the adhesive layer on the flexible substrate is transferred to the high points or lands of the printhead components within a predetermined time of the coating of the flexible substrate by placing it in contact therewith and then peeling it away from the printhead component. The transferred adhesive layer remaining on the printhead component enters an intermediate non-tacky curing stage to assist in subsequent alignment for the printhead components. The printhead components are then aligned and the adhesive layer cured to complete the fabrication of the printhead.

U.S. Pat. No. 4,412,224 to Sugitani discloses a method of forming an ink jet printhead. The ink jet printhead comprises an ink flow path and an ink ejecting nozzle for discharging ink at one end of the ink flow path. The ink flow path is formed by a groove produced at the surface of a substrate by a photoforming technique.

U.S. Pat. No. 4,577,202 to Hara discloses an ink jet printhead for a recording apparatus. A heat generating section is located between at least one pair of confronting electrodes with at least one of the electrodes having a portion lying under an ink storage chamber. The heating generating section comprises a first layer of an inorganic dielectric material, a second layer of an organic material, and a third layer of an inorganic material.

U.S. Pat. No. 4,611,219 to Sugitani et al discloses a thermal ink jet printhead comprising a flat substrate with an array of orifices therein and a base structure on which the flat substrate with the orifices is mounted.

The base structure includes a plurality of chambers for receiving the ink and each chamber is exclusively associated with a set of orifices. Each chamber has a number of separate branch paths for conveying the ink to its associated set of orifices in a direction generally parallel to the plane of the flat substrate. Each branch path of the ink has a pressure generating transducer, such as a bubble generating resistor, to eject ink from a corresponding orifice in a direction transverse to the flow direction of the ink in the branch path.

U.S. Pat. No. 4,638,337 to Torpey et al discloses a thermal ink jet printhead having a plurality of capillary filled ink channels each having a droplet emitting nozzle at one end and coupled to an ink supply manifold at the other end. Each channel has a heating element upstream from the nozzle that is located in a recess. The recess walls containing the heating elements prevent the lateral movement of the bubbles through the nozzles and therefore prevent the sudden release of vaporized ink to the atmosphere.

As taught by at least some of the above-mentioned patents, thermal ink jet printheads may be batched produced by placing a plurality of sets of heating elements on one substrate and anisotropically etching plurality of sets of channel grooves and associated manifolds in a second silicon wafer. These were aligned and bonded together and then diced into a plurality of individual printheads. In order to make electrical interconnection to the printhead, such as by wire bonding, to an electrode board commonly referred to as a daughter board, relief grooves had to also be etched in the silicon wafer around each set of ink channels and manifolds, so that when bonded to the heating element substrate, a dicing element could remove the silicon directly above the addressing electrode terminals without contact and damage thereto. The relief groove also prevented contamination of these terminals or contact pads by preventing the application of adhesive thereover during the bonding of the silicon wafer and the heating element substrate.

As discussed later with respect to FIG. 4, flat dicing blades may be used to remove the unwanted silicon material from around the addressing electrode contact pads. However, the anisotropically etched relief grooves, though successful, provide a wafer which relatively fragile before being bonded to the heating element substrate. Thus, the prior art devices encountered a significant problem of channel wafers being broken during handling prior to successful alignment and bonding to the heating element plate.

SUMMARY OF THE INVENTION

It is an object of the present invention to provide an improved ink jet printhead having more rigid components and being more cost effective to fabricate than prior art devices.

It is another object of this invention to provide a channel wafer which does not have or require silicon relief grooves that permit removal of the silicon therefrom in areas over the wire bonding pads on an associated substrate without damage thereto, after the wafer and substrate are aligned and bonded together to form a plurality of attached printheads awaiting separation.

In the present invention, a plurality of ink jet printheads are fabricated from two substrates, at least one of which is a (100) silicon wafer. The surfaces of the silicon wafer are coated with an etched resistant material, each side is patterned to produce a plurality of vias on each side thereof for orientation dependent etching of a plurality of recesses on opposite sides that are abounded by {111} planes, the etching being timed so that one recess is formed which will later serve as the ink manifold and the other recess opens into the floor of the manifold recess and serves as the fill hole. The surface having the manifold recess has formed therein a plurality of grooves which may be produced by etching or by dicing. Alternatively, the silicon wafer may be etched from one side only to form the reservoir with fill hole by etching a slot completely through the wafer. A plurality of linear arrays of resistant material is formed on one surface of the other substrate for use as heating elements, and a pattern of addressing electrodes is formed on the same substrate surface for enabling individual addressing of each of the heating elements with current pulses. A passivation layer is placed over the addressing electrodes and heating elements. The passivation layer is removed from the terminal ends of the electrodes to enable electrical connection thereto such as by wire bonding. A thick film insulative layer having a predetermined thickness is formed over the passivation layer, the thick film layer is photolithographically patterned so that the thick film material is removed from over each heating element and a plurality of troughs are formed in the thick film substrate to expose the terminal ends of each of the addressing electrodes and common return. The plurality of ink jet printheads are simultaneously made by first aligning the heating elements with the grooves in the silicon wafer and bonding the two surfaces together, and the unwanted silicon material above the electrode terminals may be removed by a low tolerance dicing blade, because the terminals are recessed in the troughs formed in the thick film layer. Next the two bonded substrates are diced into individual printheads.

BRIEF DESCRIPTION OF THE DRAWINGS

FIG. 2 is a cross sectional view of an enlarged manifold recess of FIG. 1A as viewed along line 2—2 thereof, after a second etching step.

FIG. 3 is an enlarged cross-sectional view of the wafer of FIG. 1A is viewed along view line 3—3 thereof showing an alignment opening and a recess for subsequent use as a fill hole that are produced by a first etching step.

FIG. 8 is an enlarged isometric view of one set of channels which were diced into one of the manifold recess walls of FIG. 5, prior to the alignment and bonding of the channel wafer to the heater substrate.

DESCRIPTION OF THE PREFERRED EMBODIMENT

Figure 1A:
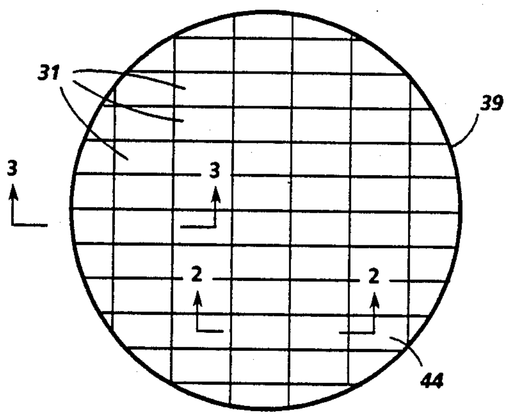
FIG. 1A PRIOR ART
FIG. 1A is a schematic plan view of a wafer having a plurality of ink manifold recesses and dicing relief grooves produced by anisotropic etching as is well known in the art.
Figure 1B:
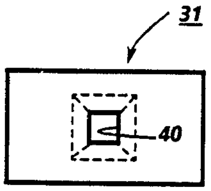
FIG. 1B PRIOR ART
FIG. 1B is an enlarged schematic plan view of one of a predetermined number of alignment openings from the wafer in FIG. 1A.
Figure 1C:
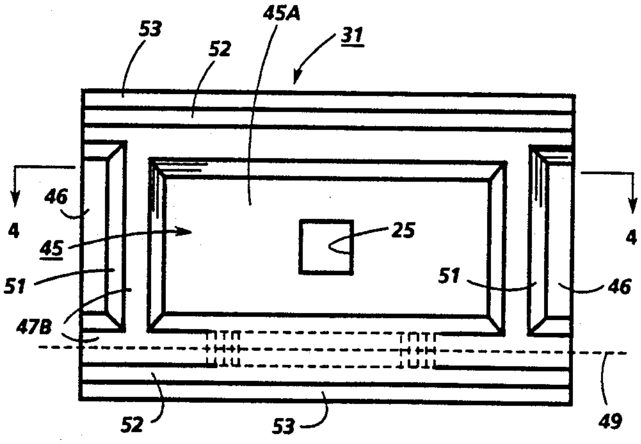
FIG. 1C PRIOR ART
FIG. 1C is an enlarged schematic plan view of one of a plurality of manifold recesses from the wafer in FIG. 1A.

In FIGS. 1A–1C, a typical prior art silicon wafer having at least two alignment apertures and a plurality of manifold recesses and other recesses and grooves for subsequent clearance of electrode terminals are shown with one manifold recess and one alignment opening shown enlarged. The manifold recess and the other recesses and grooves for electrode terminal clearance were formed by anisotropic etching as disclosed in the above identified patents, such as, for example, U.S. Pat. No. 4,638,337. A two side polished, (100) silicon wafer 39 may be used, for example, to produce a plurality of upper substrates 31 for the printhead. After the wafer is chemically cleaned, a pyrolytic CVD silicon nitrite layer 47 (see FIG. 3) is deposited on both sides. Using conventional photolithography, a via for fill hole 25 for each of the plurality of upper substrates 31 and, at least two vias for alignment openings 40 at predetermined locations are printed on one wafer side 42 opposite the side shown in FIGS. 1A and 1C. The silicon nitride is plasma etched off of the patterned vias representing the fill holes in alignment openings. As in the printhead fabrication process discussed in U.S. Pat. No. 4,601,777 to Hawkins et al, referred to earlier in the Background section, a potassium hydroxide (KOH) anisotropic etch may be used to etch the fill holes and alignment openings. In this case, the {111} planes of the (100) wafer make an angle of 54.7° with the surface of the wafer. The fill holes are small square surface patterns of about 20 mils (0.5millimeters) per side and the alignment openings are about 60 to 80 mils (1.5 to 2.0 millimeters) square. Thus, the alignment openings are etched entirely through the 20 mil (0.5 mm) thick wafer, while the fill holes are etched to a terminating apex 43 at about half way to three-quarters through the wafer (see FIG. 3). The relatively small square fill hole is invariant to further size increase with continued etching, so that the etching of the alignment openings and fill holes are not significantly time constrained. This etching takes about two hours and many wafers can be simultaneously processed.

Next, the opposite side 44 of the wafer 39 is photolithographically patterned, using the previously etched alignment holes as a reference, to form the relatively large rectangular recesses 45 that will eventually become the ink manifold of the printheads. Also patterned are two recesses 46 between the manifolds in each substrate 31 and adjacent each of the shorter walls 51 of the manifold recesses. Parallel elongated grooves 53, which are parallel and adjacent each longer manifold recess wall 52, extend entirely across the wafer suface 44 and between the manifold recesses of adjacent substrate 31. The elongated grooves do not extend to the edge of the wafer as explained in the prior art patents. The tops 47*a* of the walls defining the manifold recesses are portions of the original wafer surface 44 that still contain the silicon nitride layer and forms the streets 47 on which the adhesive will be applied later for bonding the wafer 39 and substrate 36 together. The elongated grooves 53 and recesses 46 provide clearance for the printhead electrode terminals during the bonding process discussed in the prior art. One of the manifold recess walls 52 of each manifold will later contain channel grooves 48 which will serve as ink channels as discussed with referenced to FIG. 8. At this stage in the process, the grooves 48 have not yet been formed, so that they are shown in dashed line FIG. 1C on top of one of the longer manifold recess walls 52 to assist in understanding where the future channels will be produced. The clearance grooves and clearance recesses required to provide electrode terminal clearance produces a relatively fragile wafer prior to alignment and bonding to the heating element substrate. This invention, discussed later, not only provides a simpler etching pattern for the manifold recesses, but also produces a more rugged etched wafer 39, thus improving the yield and improving the cost effectiveness of the fabricating process for the ink jet printheads.

It is disclosed in the prior art, a KOH solution anisotropic etch is used to produce the recesses but, because of the size of the surface pattern, the etching process must be timed to stop the depth of the manifold recesses. Otherwise, the pattern size is so large that the etchant would etch entirely through the wafer. The floor 45*a* of the manifold recess is determined at a depth where the etching process is stopped. This floor 45*a* is low enough to meet or slightly surpass the depth of the fill hole apex 43, so that the opening is produced that is suitable for use as the fill hole 25. After the channel wafer 39 has been etched, parallel grooves 48 are milled into a predetermined recess wall 52 of each upper substrate 31 by any dicing machine as is well known in the art. Each groove 48, as shown in FIG. 8, is about 20 mils (0.5 mm) long and has a depth and width of about 1 mil (0.25 microns). The lineal spacing between the axial center lines of the grooves are about 3 mils (0.75 microns). The silicon nitride layer 47 on wafer side 44 forms the bonding surfaces and a coating of an adhesive, such as a thermal setting epoxy, is applied in a manner such that it does not run or spread into the grooves 48 or other recesses as disclosed in U.S. Pat. No. 4,678,529 to Drake et al.

In accordance with U.S. Pat. No. 4,638,337, the alignment openings 40 are used, for example, with a vacuum chuck mask aligner to align the channel wafer 39 via the alignment marks on a heating element and addressing electrode substrate (not shown). The wafer and substrate are accurately mated and tacked together by partial curing of the adhesive. The grooves 48 automatically are positioned, so that each one has a heating element therein located a predetermined distance from the nozzles 27 or groove 48 open ends at the channel plate edge 29 (see FIGS. 8 and 9). The wafer and substrate are cured in an oven or laminator to permanently bond them together, and the channel wafers milled to produce individual upper substrates.

Figure 4:
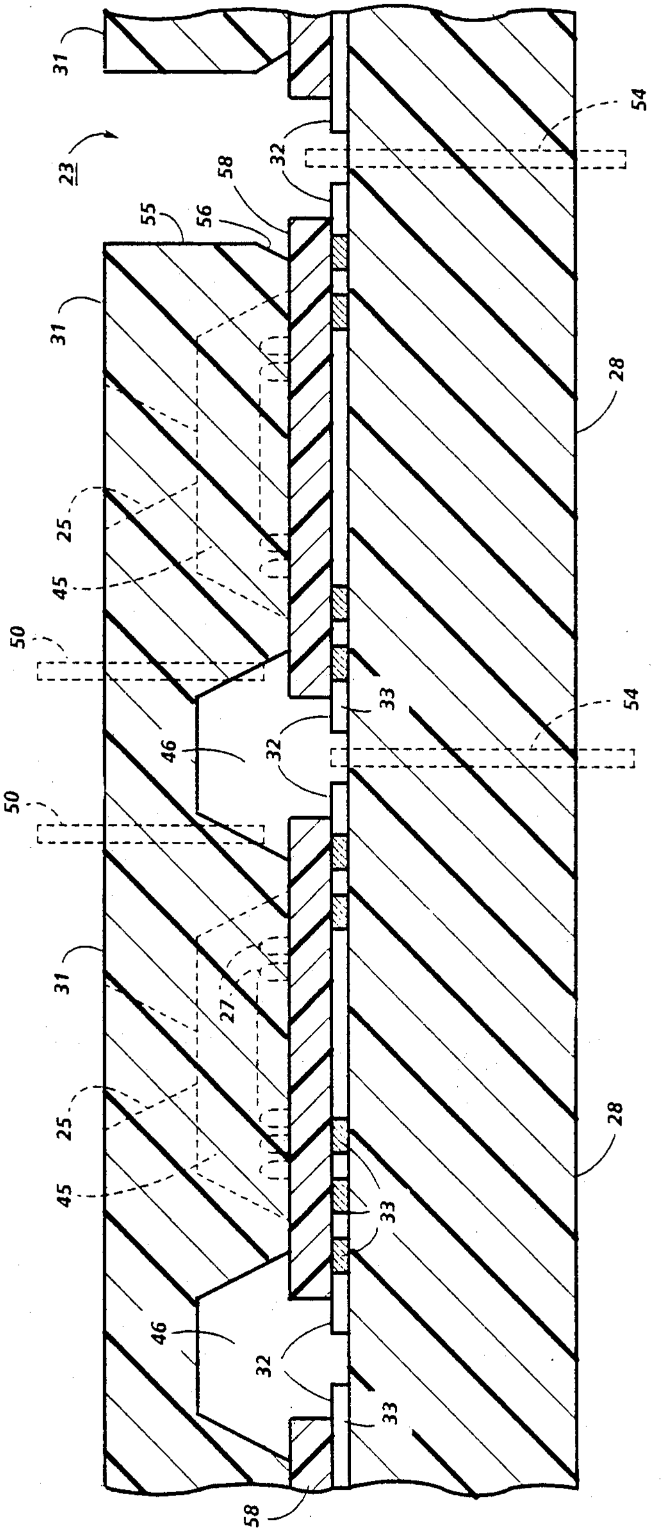
FIG. 4 PRIOR ART
FIG. 4 is an end view of channel plate and heater plate after they have been aligned and bonded together with the dicing blade being shown in dashed line in order to show the prior art method of removing unwanted silicon which covers the electrode terminals.

Referring to FIG. 4, an enlarged cross sectional view of wafer 39, after etching to produce the plurality of individual channel plates 31, is shown aligned with and bonded to substrate 28 which contains the plurality of sets of heating elements and addressing electrodes. The cross sectional view is depicted as viewed along view line 4—4 in FIG. 1C. Thick film layer 58 is shown as disclosed in U.S. Pat. No. 4,638,337, but this layer is optional if lower droplet velocity is acceptable. Recess 46 provides relief above the contact pads or terminal ends 32 of the addressing electrodes 33. The ink manifolds 45, fill holes 25, and nozzle 27, are shown in dashed line, since they are not otherwise visible in this view. Dicing blade 50 is also shown in dashed line to show how the unwanted silicon material is removed from the wafer 39 prior to dicing the substrate 28 into individual printheads as depicted by the dicing blade 54 shown in dashed line. This unwanted silicon is shown removed at one side location 23. A dicing cut made perpendicular to each set of channels 48 in each row of channels 31 in the wafer produces the edge face 29 shown in FIGS. 8 and 9. In FIGS. 1 and 2, the plane 49 is shown in dashed line to indicate where the dicing machine cuts to produce the nozzles bearing face 29. The dicing cuts by dicing blade 50 produces parallel side walls 55 with sloping surface portions 56 at the interfaces with the heater plates 28. The sloping surfaces were formed along the {111} planes of the silicon wafer, so that they have an angle of 54.7° with the wafer surfaces 42,44.

Figure 5A:
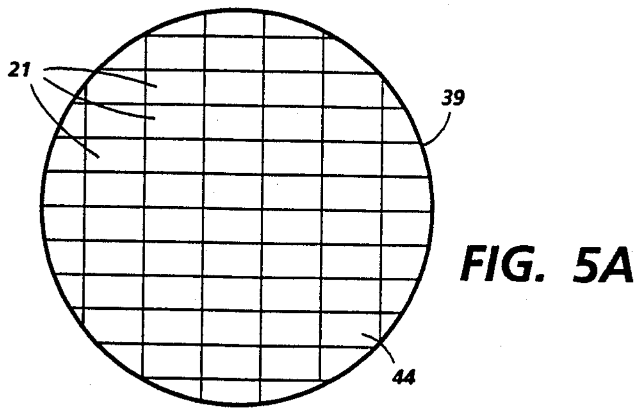
FIG. 5A is a schematic plan view of a wafer having a plurality of ink manifold recesses and a predetermined number of alignment openings in accordance with the present invention.
Figure 5B:
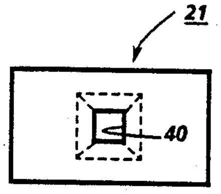
FIG. 5B is an enlarged schematic plan view of one of a predetermined number of alignment openings from the wafer in FIG. 5A.
Figure 5C:
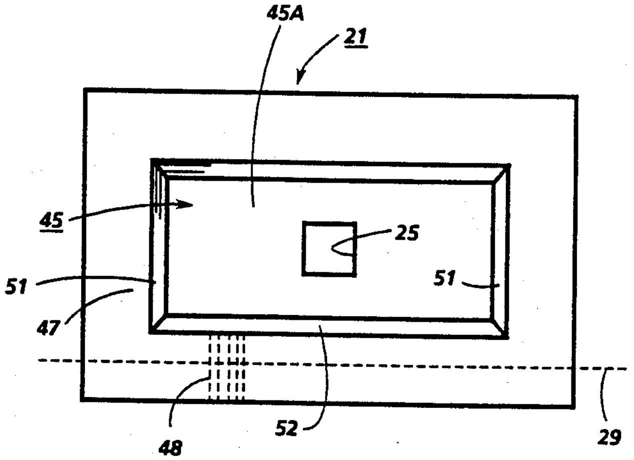
FIG. 5C is an enlarged schematic plan view of one of a plurality of manifold recesses from the wafer in FIG. 5A.

FIGS. 5A–5C are similar to FIGS. 1A–1C, showing a plurality of channel plates 21 with a simpler, more rigid channel plate having only recess 45 and intersecting recess 25, which serve as the ink manifold and fill hole respectively. Each recess has end walls 51 and elongated side walls 52 intersecting floor 45a, which contains the fill hole 25. The channel grooves 48 may be formed by a dicing operation in a subsequent operation and are shown in dashed line. Plane 29 is shown in dashed line to show where a subsequent dicing operation will form in face 29 to provide channels of the appropriate length and contain nozzles 27.

Figure 6:
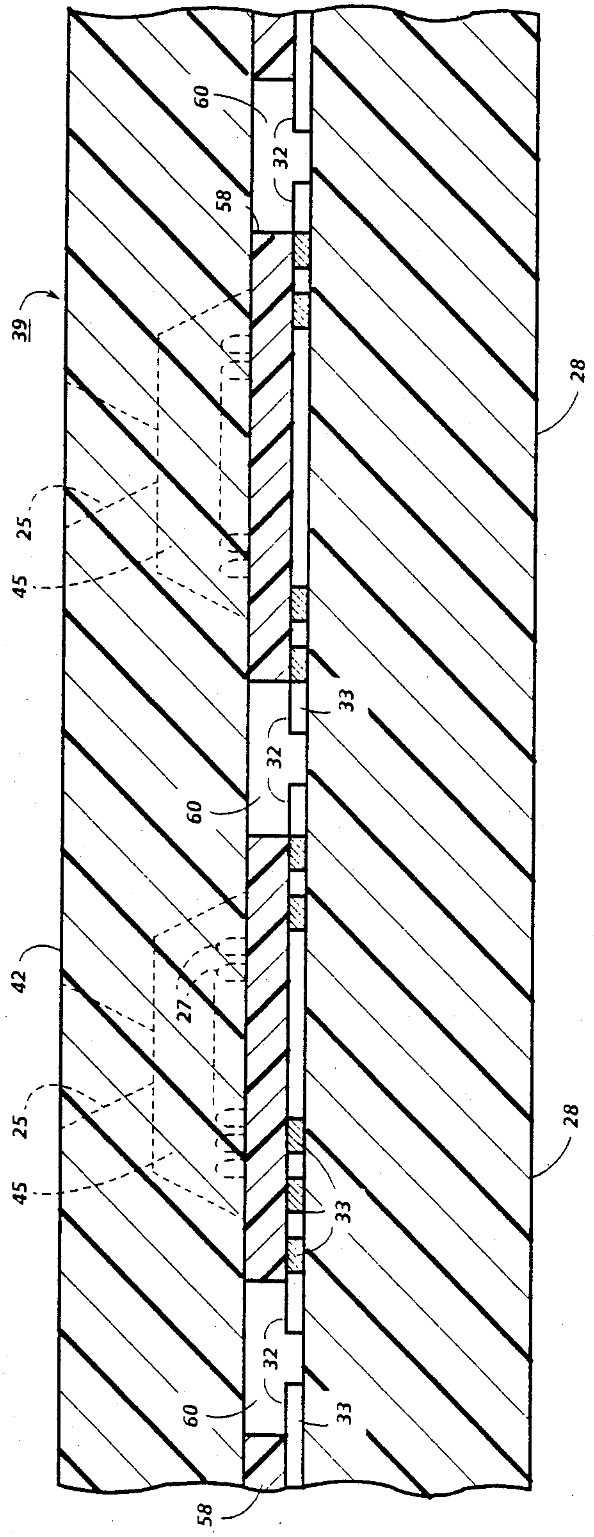
FIG. 6 is an enlarged cross-sectional end view of the channel wafer and heater substrate after they have been aligned and bonded together showing the thick film layer and relief therein for clearance of electrode terminals, the addressing electrodes being omitted for clarity.
Figure 7:
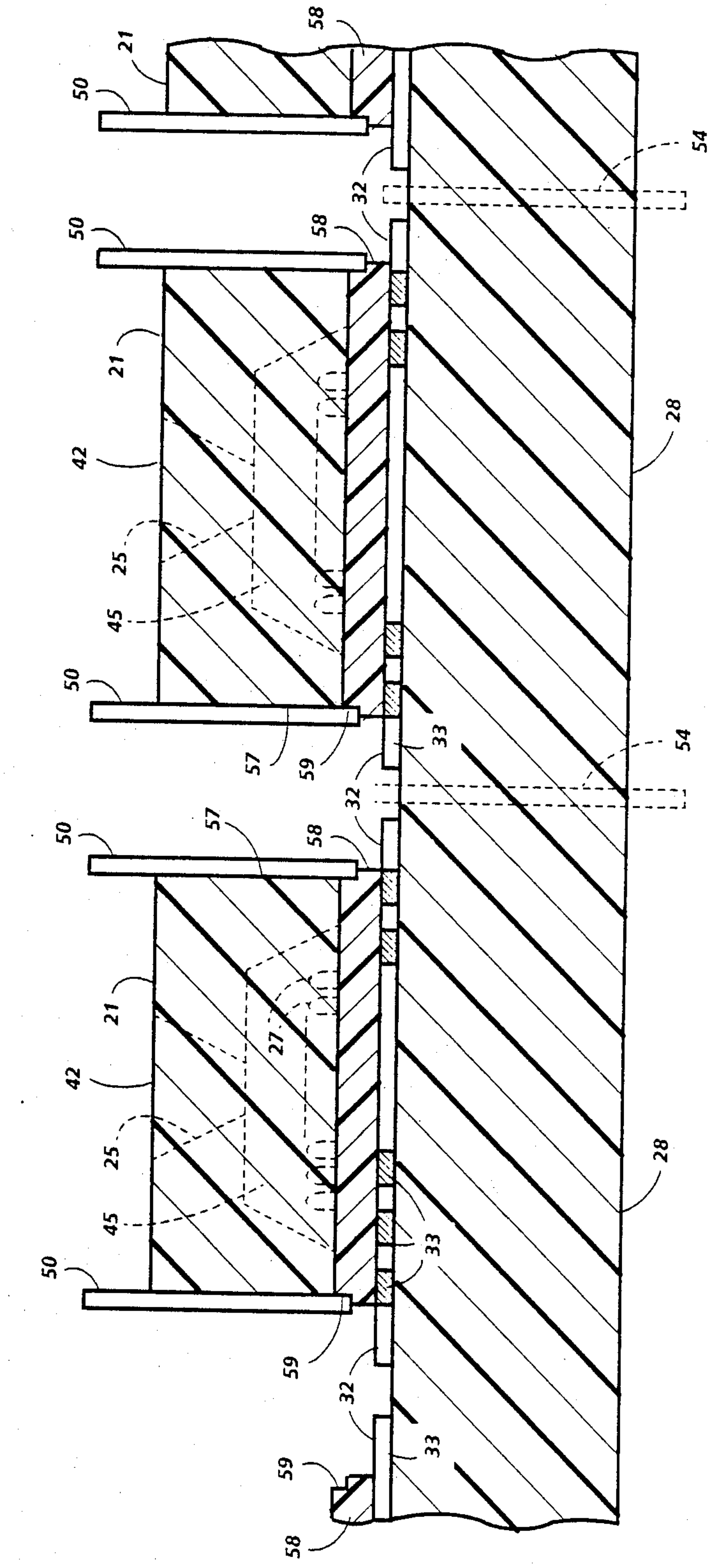
FIG. 7 is an enlarged cross-sectional end view of the bonded and aligned channel wafer and heater substrate showing th dicing blade location for removal of the unwanted silicon material above the electrode terminals, the addressing electrodes being omitted for clarity.

A fabricating process for the present invention is clearly shown in FIGS. 6 and 7. Etched channel wafer 39 is shown aligned and bonded with the heater substrate 28 with a thick film layer 58 therebetween which is photolithographically patterned to remove that portion (not shown) of the thick film layer over the heating elements and that portion 60 over the addressing electrodes and common return terminals. The etched manifolds and intersecting fill holes, as well as the nozzles 27, are shown in dashed line, to illustrate that a space is formed between the channel wafer and the heater substrate where the electrode terminals 32 are located. FIG. 7 shows the dicing blade 50 in place to remove the unwanted silicon material above the electrode terminals. The channel plates 21 formed by the dicing operation have vertical walls 57, and the dicing blades remove a portion of the corner edges of the thick film layer 58 to assure complete removal of the silicon. This causes a step 59 to be formed in the edge of the thick film layer as more clearly shown in FIG. 9.

In the preferred embodiment, a two side polished, (100) silicon wafer 39 is used to produce the plurality of channel plates 21 for the printhead of the present invention. After the wafer is chemically cleaned, a pyrolytic CVD silicon nitride layer (not shown) is deposited on both sides. Vias for fill hole 25 for each of the plurality of channel plates 21 are photolithographically produced. At least two vias for alignment openings 40 at a predetermined locations are printed on the wafer side 42, which is opposite to side 44 shown in FIGS. 5A–5C. The silicon nitride is plasma etched off of the patterned vias representing the fill holes and alignment openings. As in the prior art printhead fabrication process discussed above in conjunction with FIGS. 1–3, a potassium hydroxide anisotropic etch is used to etch the fill holes and alignment openings. The fill holes and alignment openings are about the same size as that of the prior art. Thus, the fill holes are etched to a terminating apex at about half-way to three quarters through the wafer while the alignment openings are etched entirely through the 20 mil thick wafer. The opposite side 44 of wafer 39 is photolithographically patterned, using the previously etched alignment holes as a reference to form the relatively large rectangular recesses 45 that will eventually become the ink manifolds of the printheads. The substrate 28, which may optionally be a silicon wafer, has a plurality of sets of bubble generating, heating elements 34 and their addressing electrodes 33 patterned on one surface thereof as disclosed in the prior art discussed above. A thick film type insulative layer 58, such as, for example, Riston®, Vacrel®, Probimer 52®, or polyimide, is formed on the passivation layer of the heating element wafer having a thickness of between 5 and 100 microns and preferably in the range of 15 to 50 microns. The insulative layer 58 is photolithographically processed to enable etching and removal of those portions of the layer 58 over each heating element and over a predetermined area covering the electrode terminals 32, 37. After the silicon material above the electrode terminals is removed by dicing blade 50 as shown in FIG. 7, the heating element substrate 28 is cut into individual printheads as shown by dicing blade 54 shown in dashed line.

Figure 9:
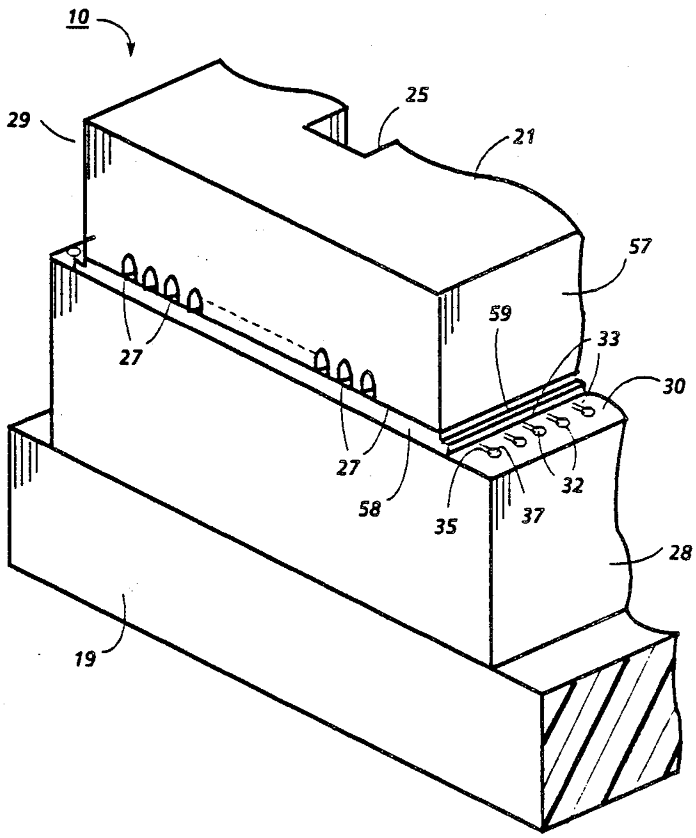
FIG. 9 is an enlarged, partially shown schematic isometric view of a printhead mounted on a daughter board showing the ink droplet emitting nozzles.

FIG. 9 is an enlarged, schematic, isometric view of the front face of printhead 10 showing the array of droplet emitting nozzles 27. The heating element plate 28 has heating elements (not shown) and addressing electrodes 33 patterned on the surface 30 thereof, while the channel plate 21 has parallel grooves which extend in one direction and penetrate through the channel plate front face 29. The other end of the grooves communicate with a common internal recess 45 shown in dashed line in FIGS. 6 and 7, and in FIG. 5C. The floor 45a of the internal recess 45 has an opening therethrough for use as an ink fill hole 25. The surface of the upper substrate 21 with the grooves are aligned and bonded to the lower substrate 28, as described above, so that a respective one of the plurality of heating elements is positioned in each channel, formed by the grooves and the lower substrate. Ink enters the manifold formed by the recess 45 and the lower substrate 28 through the fill hole 25 and by capillary action fills the channels. The ink at each nozzle forms a meniscus, the surface tension of which prevents the ink from weeping therefrom. Addressing electrodes 33 on the lower substrate 28 terminate at terminals or contact pads 32 and the common electrode return 35 terminates at contact pads 37. The channel plate 21 is smaller than that of the lower substrate in order that the electrode terminals 32, 37 are exposed and available for wire bonding to the electrodes of the daughter board 19 on which the printhead 10 is permanently mounted. Layer 58 is a thick film passivation layer, discussed above, which is sandwiched between the channel plate and the lower substrate or heater plate. This layer is etched to expose the heating elements, thus placing them in a recess or pit as disclosed in U.S. Pat. No. 4,638,337. This layer is also etched, as discussed in connection with FIGS. 6 and 7, to permit removal of the unwanted silicon material between channel plates by a dicing blade 50 to form parallel sidewalls 57. By using the thickness of the thick film layer 58 to space the channel plate above the heating element plate 28, no anisotropically etched relief recesses or grooves are required thus providing a more rigid etched channel wafer. The printhead fabrication methods disclosed in the prior art provided a serious yield problem because the etched channel wafers were very fragile and a significant percentage broke during handling. With this clearance being provided by the thick film layer 58, a simpler, more rigid channel wafer is possible.

Figure 10A:
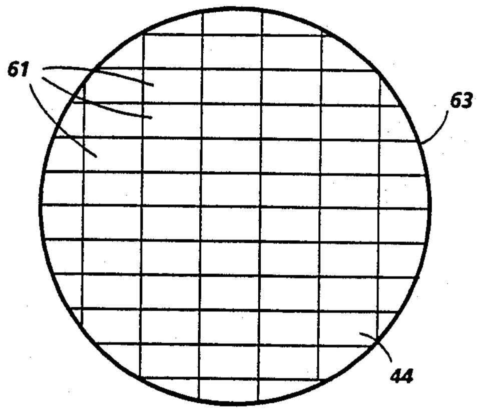
FIG. 10A is a schematic plan view of a wafer having a plurality of ink manifold recesses and a predetermined number of alignment openings in accordance with an alternate embodiment of the present invention.
Figure 10B:
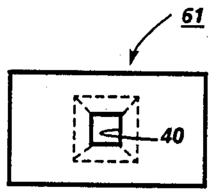
FIG. 10B is an enlarged schematic plan view of one of a predetermined number of alignment openings from the wafer in Figure 10A.
Figure 10C:
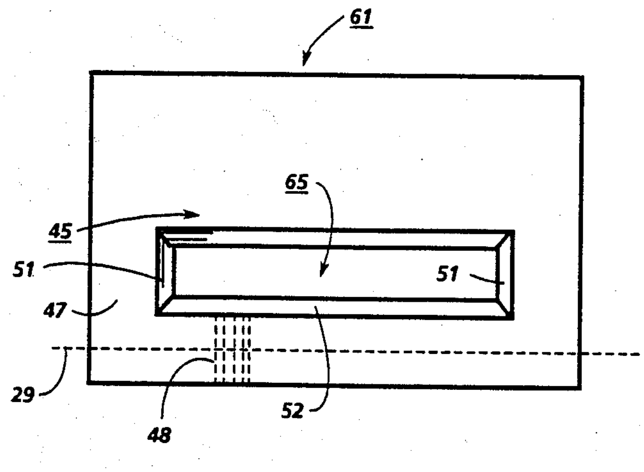
FIG. 10C is an enlarged schematic plan view of one of a plurality of manifold recesses from the wafer in FIG. 10A.

In the preferred alternate fabrication embodiment of FIGS. 10A–10C, all of the etching is done from one side of the wafer 63. Therefore, only a single-side-polished, (100) wafer 63 is required, as disclosed in the abovementioned U.S. Pat. No. 4,601,777 to Hawkins et al and incorporated herein by reference. On the chemically cleaned, single-polished surface of the wafer, a layer 47 of pyrolytic CVD silicon nitride is deposited. A mask for the plurality of the manifolds and alignment openings are printed on the silicon nitride layer using conventional photolithography. The silicon nitride 47 is plasma etched from the printed areas of the mask on the surface of the wafer. Next, a KOH anisotropic etch is used to etch completely, the wafer. This takes about two hours and many wafers can be simultaneously processed. The etching depth depends upon the surface area of the wafer exposed to the etchant. The recesses for the alignment opening 40 and the manifold 65 are sized so that the etchant etches through the wafer. The channel grooves 48 shown in dashed line may be either diced in later or currently etched as also disclosed in U.S. Pat. No. 4,601,777. The manifold recess is bounded by walls 51 and 52 which lie along {111} planes. The fill hole is now the open bottom of the manifold recess 65. In all the other respects, this alternrate fabrication method is the same as the one for the two-sided wafer embodiment discussed above with respect to FIGS. 5 through 7.

The original surface of the wafer 63 with silicon nitride layer 47 serves as the bonding area for bonding the wafer to the heating element substrate 28, the wafer having the plurality of sets of channels with associated manifolds and the substrate 28, which may also be a silicon wafer, having the plurality of sets of heating elements and addressing electrodes. The bonding area is coated with a thermosetting epoxy resin and then the two structures are aligned together by using an infrared aligner-bonder which holds the channel wafer and aligns the channel wafer with the heating element substrate. Instead of using alignment holes 40 in the wafer 63, alignment marks (not shown) on this wafer can be used which are opaque to an infrared microscope. The alignment marks (not shown) on the substrate having the plurality of sets of heating elements 34 can be aluminum patterns, for example, which are also infrared opaque. Therefore, use of an infrared microscope with infrared opaque markings on each structure to be aligned is yet another alternative technique to align the wafer and heating element substrate together.

Prior to the alignment, the top 47 of the wafer is coated with a layer of adhesive, with care being taken not to permit the adhesive to run or weep into the channels 48.

The wafer 63 and substrate 28 are tacked together and cured permanently in a laminator. The printhead electrode terminals are cleared by milling the wafer portions as shown in FIGS. 6 and 7. Next, the heating element substrate is diced into a plurality of individual printheads, forming the nozzles 27 in the freshly cut face 29. FIG. 9 is an enlarged, isometric view of the finished printhead, but, in this embodiment, would have an elongated slot (not shown) for a fill hole, since the manifold 65 was etched through the channel plate 61. Note channel plate 21 in Figure 9 shows the fill hole 25 formed by the two step etching progress of Figure 5. Each printhead is permanently mounted on a daughter board 19 and the respective electrodes are wire-bonded together. The wire bonds (not shown) and pads or terminals 32, 37 are coated with a passivation layer of silicone encapsulation compound, such as Dow Corning 3-6550 RTV TM. This layer electrically isolates the electrodes and wire bonds.

Many modifications and variations are apparent from the foregoing description of the invention and all such modifications and variations are intended to be within the scope of the present invention.

We claim:

1. A method for fabricating a plurality of printheads, each printhead being usable in an ink jet printing device for emitting and propelling ink droplets toward a recording medium, the method comprising the steps of:

(a) cleaning a (100) silicon wafer and a similar sized substrate, each having first and second substantially parallel surfaces;

(b) forming a layer of etch resistant material on at least the first surface of the wafer;

(c) forming a plurality of sets of equally spaced, linear arrays of resistive material on the first surface of the second substrate for use as sets of heating elements, and forming a plurality of sets of addressing electrodes on the same substrate surface for enabling individual addressing of each heating element with current pulse, at least some of the electrodes terminating with a contact pad;

(d) depositing a thick film insulative layer having a thickness in the range of 5 to 100 micrometers over the second substrate first surface and heating element and electrode sets thereon;

(e) patterning the thick film insulative layer to produce a via over and in alignment with each heating element and a set of large vias over each set of electrode end portions having the contact pads and etchant removal of the portions of the thick film insulative layer exposed by these vias to form recesses about each heating element and at least one large recessed trough for each set of electrode contact pads to provide access thereto;

(f) photolithographically patterning the etch resistant layer on the first surface of the wafer to produce a plurality of sets of vias of predetermined sizes and at predetermined locations therein;

(g) anisotropic etching of the wafer to produce sets of recesses in its first surface, each recess being bounded by {111} plane side walls;

(h) forming a plurality of sets of equally spaced, parallel grooves through the first surface of the wafer and its etch resistant layer, each groove having a predetermined depth and first and second ends, the first ends of each set of grooves communicating with an associated one of the recesses and the second ends of each set of grooves being open;

(i) aligning and bonding the wafer and the substrate with their first surfaces confronting each other and sandwiching the thick film insulative layer therebetween, the alignment assuring that each groove contains a one of the heating elements spaced a predetermined distance from the second open ends thereof and the bonding permanently attaching the wafer and substrate together, so that each recess in the set of recesses communicating with a set of grooves serves as an ink supplying manifold, while each set of grooves serves as ink channels, with its second open ends serving as nozzles;

(j) removing the silicon material of the wafer aligned with each large trough in the thick film insulative layer by a dicing operation to expose the sets of contact pads, the thickness of the thick film insulative layer providing the clearance necessary to prevent damage to the contact pads, during this silicon removal step; and (k) dicing the bonded wafer and substrate into a plurality of individual printheads, each printhead having a manifold, a set of channels communicating with the manifold at one end thereof and having nozzles at the other end with heating elements in each a predetermined distance from the nozzles, and addressing electrodes for selectively addressing the heating elements.

2. The method of claim 1, wherein the second substrate is silicon.

3. The method of claim 1, wherein recesses formed in step (g) are elongated through holes bounded by {111} planes which will subsequently serve as ink manifolds and the open bottoms will subsequently serve as ink fill holes.

4. The method of claim 3, wherein the parallel sets of parallel grooves formed in step (h) are formed by dicing, and wherein the bonding of step (i) is accomplished by placing an adhesive layer of predetermined thickness on the thick film insulative layer prior the alignment and mating with the wafer, so that said adhesive is not permitted to cover the contact pads.

* * * * *